United States Patent [19]

Choi et al.

[11] Patent Number: 5,741,716
[45] Date of Patent: Apr. 21, 1998

[54] METHOD FOR FABRICATING THIN FILM TRANSISTOR

[75] Inventors: Jin Ho Choi; Sung Wook Yin, both of Ichonshi, Rep. of Korea

[73] Assignee: Hyundai Electronics Industries Co., Ltd., Rep. of Korea

[21] Appl. No.: 740,423

[22] Filed: Oct. 29, 1996

[30] Foreign Application Priority Data

Nov. 3, 1995 [KR] Rep. of Korea .................. 1995-39629

[51] Int. Cl.$^6$ .......................... H01L 21/84; H01L 21/265
[52] U.S. Cl. ............................... 437/21; 437/40; 437/186
[58] Field of Search ..................... 437/21, 40–41, 437/186

[56] References Cited

U.S. PATENT DOCUMENTS

| | | | |
|---|---|---|---|
| 5,372,959 | 12/1994 | Chan | 437/41 |
| 5,374,573 | 12/1994 | Cooper et al. | 437/41 |
| 5,411,910 | 5/1995 | Son | 437/52 |
| 5,432,122 | 7/1995 | Chae | 437/101 |
| 5,532,956 | 7/1996 | Watanabe | 365/149 |
| 5,539,219 | 7/1996 | Den Boer et al. | 257/72 |
| 5,561,308 | 10/1996 | Kamata et al. | 257/301 |

*Primary Examiner*—John Niebling
*Assistant Examiner*—Richard A. Booth
*Attorney, Agent, or Firm*—Blakely Sokoloff Taylor & Zafman

[57] ABSTRACT

The present invention relates to a TFT comprising: a cylindrical gate electrode formed on a substrate, a gate electrode insulating film formed on said gate electrode, and a round polysilicon channel layer formed on said gate electrode insulating film, wherein said channel layer covers a predetermined portion of said gate electrode insulating film including the inside wall portion and a part of the upper portion of said cylindrical gate electrode, and a method fabricating thereof. The present invention provides improved characteristics of a TFT by increasing the amount of ON current thereof with maximized channel width while the channel length is maintained at a constant value.

2 Claims, 5 Drawing Sheets

CHANNEL LENGTH OF TFT

METHOD FOR FABRICATING THIN FILM TRANSISTOR

BACKGROUND OF THE INVENTION

1. Field of the Invention

This invention relates to a thin film transistor (TFT) and a method for fabricating the same, and more particularly to a of cylindrical structure to improve the characteristics of the TFT by achieving sufficient channel width.

2. Description of the Prior Art

Generally, in order to improve the characteristic of a TFT, it has been commonly used to change the grain size in a channel polysilicon layer or the material of a channel layer by various methods, such as a passivation of the interface trap state. Alternatively, the source overlap structure or drain offset structure has been used to improve the characteristics of a TFT.

However, with the development of the integrated circuits, it becomes impossible to vary the channel width or length of a TFT because it is more difficult to obtain a sufficient cell area for the TFT. And this problem will become more serious in the future.

SUMMARY OF THE INVENTION

Therefore, the present invention has been made in view of the above mentioned problem. Therefore, it is an object of the present invention to provide a TFT of cylindrical structure to improve the characteristics of a TFT by achieving sufficient channel width and to provide a method for fabricating the same.

In accordance with the present invention, the above object can be accomplished by a TFT including: a cylindrical gate electrode formed on a substrate a gate electrode insulating film formed on the gate electrode, and a round polysilicon channel layer formed on the gate electrode insulating film, wherein the channel layer covers a predetermined portion of the gate electrode insulating film including an inside wall portion and a part of upper portion of the cylindrical gate electrode.

Also, the above object can be accomplished by a method for fabricating a TFT including the steps of: forming a conductive layer on a substrate with an interlayer insulating layer between the substrate and the conductive layer, forming a cylindrical gate electrode by pattering the conductive layer, forming an insulating layer on the entire structure, forming a polysilicon layer on the insulating layer, forming a round polysilicon channel layer by patterning the polysilicon layer, forming an insulating layer on the resulting structure, forming a spacer on a side part of the gate electrode and the polysilicon channel layer by blanket etching of the insulating layer, implanting ions on the polysilicon channel layer for forming source and drain, forming an interlayer insulating layer on the resulting structure, forming a contact hole by selective etching of said insulating layer, and forming a Vcc line being connected to the polysilicon channel layer through said contact hole.

DETAILED DESCRIPTION OF THE PREFERRED EMBODIMENT

The present invention will be described in detail hereinafter with reference to the attached drawings.

According to the present invention, in order to maximize the channel width of a TFT and maintain the length of it at a constant value, a TFT with a cylindrical structure is provided.

Figure 1:
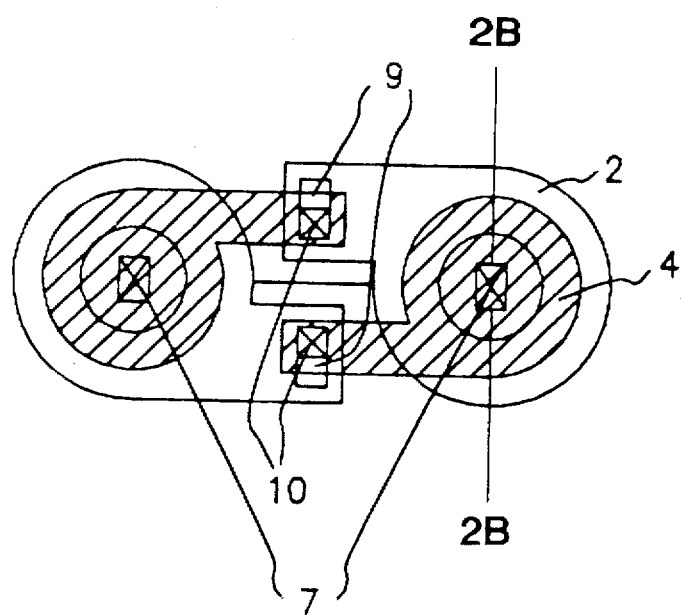
FIG. 1 is a layout of a TFT according to the present invention.

FIG. 1 is a layout of a TFT according to the present invention. In the drawing, reference numeral 2 denotes a gate electrode of the TFT, 4 a channel polysilicon of the TFT, 7 a Vcc contact, 9 a gate electrode contact and 10 a channel polysilicon contact, respectively.

FIGS. 2A to 2H are cross sectional views taken along the line B–B' of FIG. 1 which illustrates a method of fabricating a TFT according to the present invention. A detailed description of an embodiment according to the present invention will be given below with reference to FIGS. 2A to 2H.

Figure 2A:
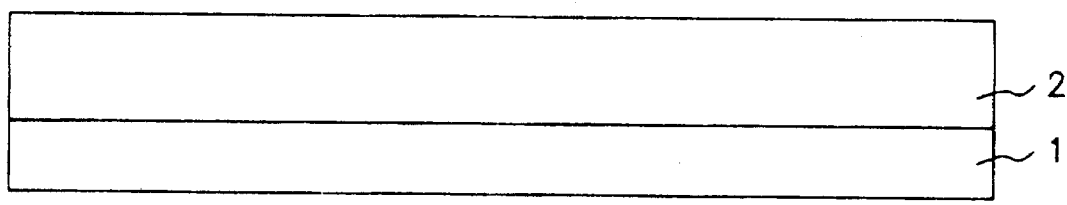
FIGS. 2A to 2H are cross sectional views which illustrate a method of fabricating a TFT according to the present invention.

First, referring to FIG. 2A, a polysilicon layer, as a conductive layer fox forming a gate electrode, is formed on an intexlayer insulating layer 1 which is formed on a substrate(not shown).

Figure 2B:
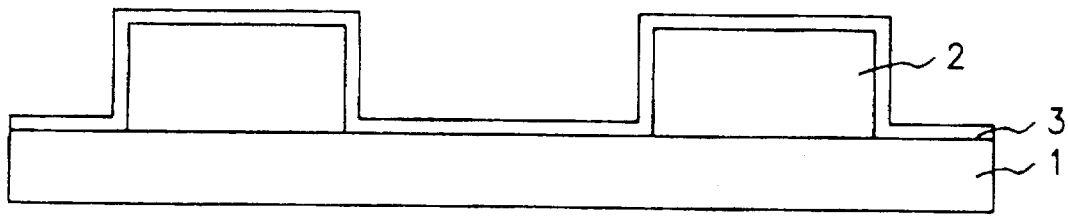

Next, referring to FIG. 2B, a cylindrical gate electrode 2, as shown in FIG. 1, is formed by patterning the polysilicon layer, and then a gate electrode oxide layer 3 is formed on the resulting structure.

Figure 2C:
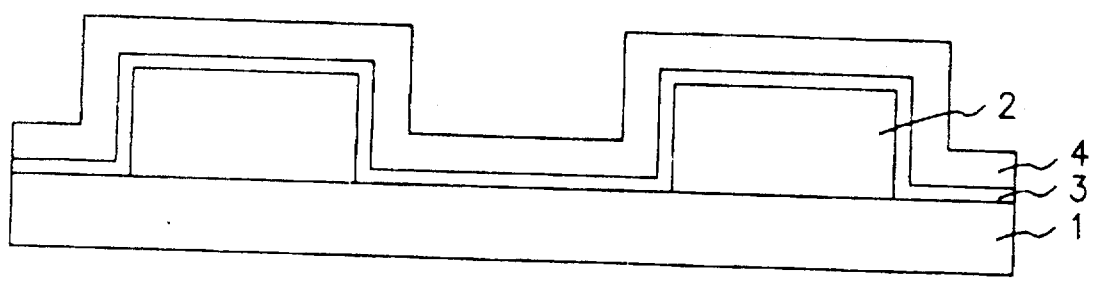

Next, referring to FIG. 2C, a polysilicon layer 4 is formed on said gate electrode oxide layer 3 for forming a channel layer of the TFT.

Figure 2D:
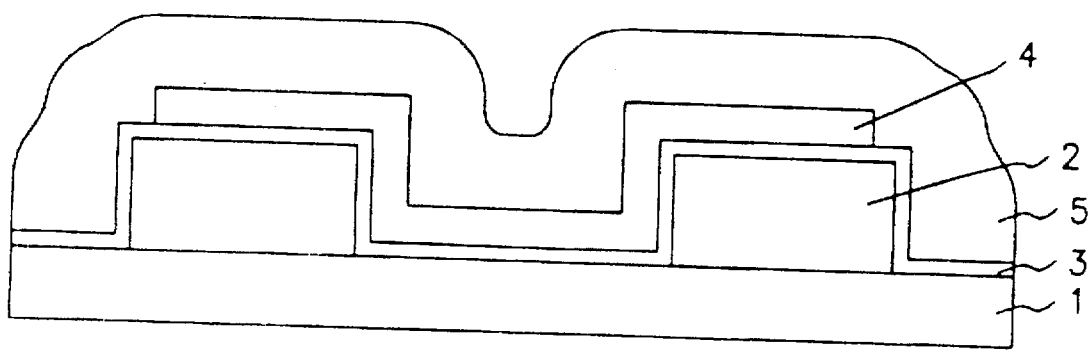

Then, referring to FIG. 2D, a round channel layer 4, as shown in FIG. 1, is formed by patterning the polysilicon layer 4, and then an insulating layer, for example, an oxide layer 5, is formed on the resulting structure.

Figure 2E:
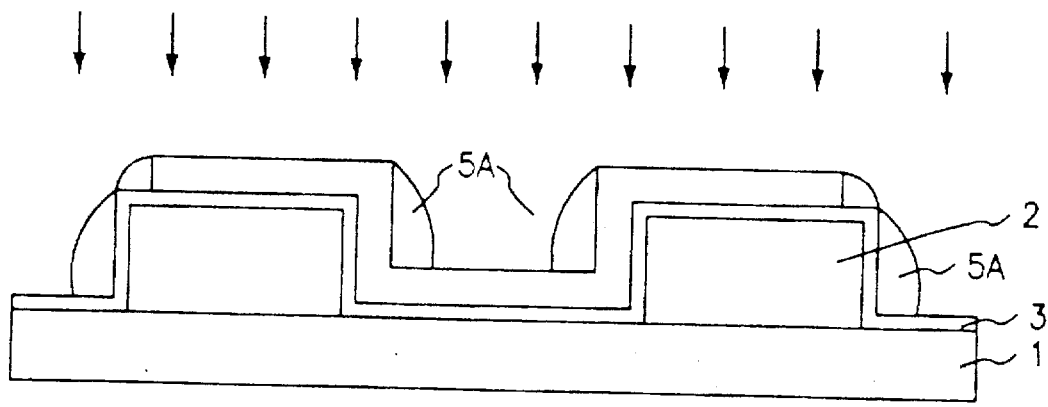

Next, referring to FIG. 2E, a spacer 5A is formed on the sidewall of the gate electrode 2 and the channel polysilicon layer 4, by applying the blanket etching process to the oxide layer 5, and then the impurity implanting processes is performed in order to form source/drain regions.

Figure 2F:
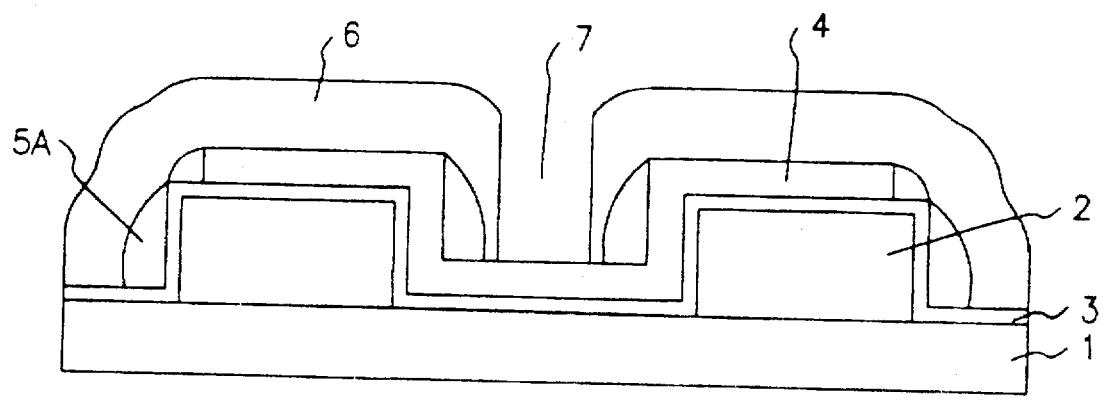

Next, referring to FIG. 2F, an interlayer insulating layer 6 is formed on the resulting structure, and then a contact hole 7 is formed for connecting the Vcc metal line to the source/drain regions, by selectively etching the interlayer insulating layer 6.

Figure 2G:
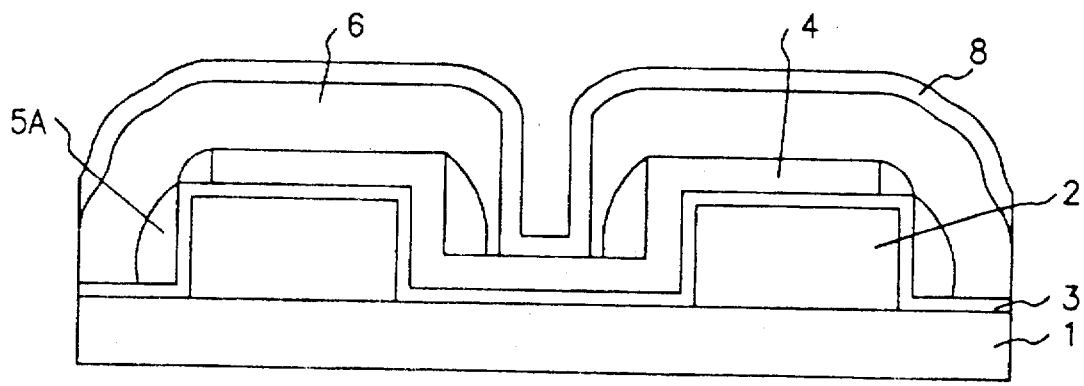

Next, referring to FIG. 2G, a conductive layer, for example, a doped polysilicon layer 7, is deposited for forming a Vcc metal line on the resulting surface including the contact hole 7 of the interlayer insulating layer 8.

Figure 2H:
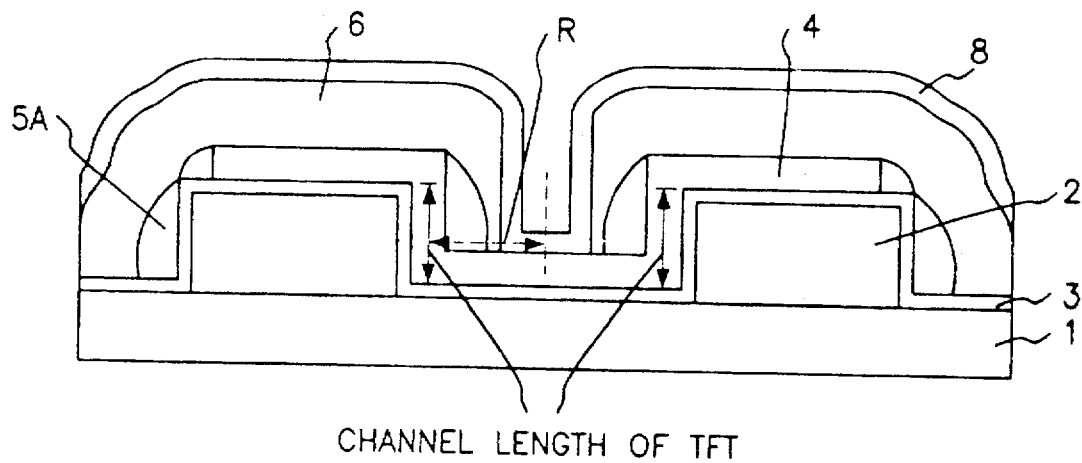

Next, referring to FIG. 2H, a Vcc metal line is formed by patterning the doped polysilicon layer 8 and the whole process for fabricating the TFT of the present invention is completed.

As is apparent from FIG. 1 and FIG. 2H, the channel width of the TFT is maximized to 2 πR, while the channel length is maintained at a constant value Therefore the present invention improves the characteristics of the TFT by increasing the amount of ON current thereof.

Also, as described above, according to the present invention, as the channel polysilicon layer is formed on the side part of the gate electrode, it is possible to achieve enough area for other memory cells, and the larger layout margin.

Although the preferred embodiment of the present invention has been disclosed for illustrative purposes, those skilled in the art will appreciate that various modifications, additions and substitutions are possible, without departing from the scope and the spirit of the present invention as disclosed in the accompanying claims.

What is claimed is:

1. A method for fabricating a TFT comprising the steps of:

forming a conductive layer on an interlayer insulating layer;

forming a cylindrical gate electrode by pattering said conductive layer;

forming a gate electrode insulating layer on the gate electrode;

forming a polysilicon layer on said gate electrode insulating layer;

forming a round polysilicon channel layer by patterning said polysilicon layer;

forming a first insulating layer on the channel layer;

forming a spacer on a sidewall of said gate electrode and said polysilicon channel layer, by applying a blanket etching process to said first insulating layer; and implanting impurities into said polysilicon channel layer so that source and drain regions are formed in said polysilicon channel layer.

2. The method as claimed as in claim 1, wherein the method further comprises the steps of:

forming a second interlayer insulating layer on the channel layer;

forming an opening by selectively etching said second insulating layer, exposing a portion of said source/drain regions; and forming a Vcc metal line being connected to said polysilicon channel layer through said opening.

* * * * *

UNITED STATES PATENT AND TRADEMARK OFFICE
CERTIFICATE OF CORRECTION

PATENT NO. : 5,741,716
DATED : April 21, 1998
INVENTOR(S) : Choi et al.

It is certified that error appears in the above-identified patent and that said Letters Patent is hereby corrected as shown below:

In column 1 at line 10, please delete " a of " and insert -- a TFT of --.

In column 2 at line 21, please delete " fox " and insert -- for --.

In column 2 at line 57, please delete " value " and insert -- value. --.

In column 2 at line 57, please delete " Therefore " and insert -- Therefore, --.

In column 3, claim 1, at line8, please delete "Pattering " and insert -- patterning --.

In column 3, claim 1 at line 9, please delete " , " and insert -- thereby forming a firt resulting structure--.

In column 3, claim 1 at line 10, please delete " gate electrode " and insert -- first resulting structure --.

In column 3, claim 1 at line 16, please delete " layer; " and insert -- layer; thereby forming a second resulting structure --.

In column 3, claim 1 at line 17, please delete " channel layer " and insert -- second resulting structure --.

UNITED STATES PATENT AND TRADEMARK OFFICE
CERTIFICATE OF CORRECTION

PATENT NO. : 5,741,716
DATED : April 21, 1998
INVENTOR(S) : Choi et al.

It is certified that error appears in the above-identified patent and that said Letters Patent is hereby corrected as shown below:

In column 3, claim 1 at line 6, please delete " layer. " and insert -- layer, thereby forming a third resulting structure.

In column 4, claim 2 at line 9, please delete " interlayer ".

In column 4, claim 2 at line 9, please delete " channel layer " and insert -- third resulting structure --.

Signed and Sealed this

Fifteenth Day of June, 1999

Attest:

Q. TODD DICKINSON

*Attesting Officer*      *Acting Commissioner of Patents and Trademarks*